(12) United States Patent
Lee et al.

(10) Patent No.: US 8,916,018 B2
(45) Date of Patent: Dec. 23, 2014

(54) APPARATUS FOR FABRICATING ORGANIC LIGHT EMITTING DISPLAY PANEL AND METHOD OF FABRICATING ORGANIC LIGHT EMITTING DISPLAY PANEL USING THE SAME

(75) Inventors: Byung-Chul Lee, Yongin (KR); Jae-Seok Park, Yongin (KR); Jae-Ha Lim, Yongin (KR); Jin-Han Park, Yongin (KR); Dong-Sul Kim, Yongin (KR)

(73) Assignee: Samsung Display Co. Ltd., Gyeonggi-do (KR)

( * ) Notice: Subject to any disclaimer, the term of this patent is extended or adjusted under 35 U.S.C. 154(b) by 132 days.

(21) Appl. No.: 13/480,167

(22) Filed: May 24, 2012

(65) Prior Publication Data

US 2013/0048201 A1 Feb. 28, 2013

(30) Foreign Application Priority Data

Aug. 29, 2011 (KR) ........................ 10-2011-0086564

(51) Int. Cl.
*B29C 65/00* (2006.01)
*B32B 37/00* (2006.01)
(Continued)

(52) U.S. Cl.
CPC ...................................... *H01L 51/56* (2013.01)
USPC ........... 156/285; 156/286; 156/382; 264/511; 264/553; 264/571; 425/504; 425/388; 430/273.1; 430/200; 347/171

(58) Field of Classification Search
CPC .... B29C 53/18; B29C 53/56; B29C 53/8016; B29C 65/00; B29C 65/02; B29C 65/14; B29C 65/16; B29C 65/1609; B29C 65/1629; B29C 65/1632; B29C 65/1635; B29C 65/1638; B29C 65/1696; B29C 66/00; B29C 66/001; B29C 66/0012; B29C 66/00145; B29C 66/0014; B65H 16/00; B65H 16/005; B65H 16/02; B65H 16/021; B65H 16/023; B65H 16/106; B65H 18/00; B65H 18/02; B65H 18/021; B65H 18/028; B65H 18/08; B65H 18/085; B65H 18/14; B65H 18/20; B65H 20/00; B65H 20/02
USPC .......... 156/285, 286, 382; 264/511, 553, 571; 425/504, 388; 430/273.1, 200; 347/171
See application file for complete search history.

(56) References Cited

U.S. PATENT DOCUMENTS 6,222,567 B1 * 4/2001 Schuster et al. ............... 347/171
7,670,450 B2 * 3/2010 Lamansky et al. ............ 156/235
(Continued)

FOREIGN PATENT DOCUMENTS

JP 2008-55467 A 3/2008
KR 10-2006-0018159 A 2/2006
(Continued)

*Primary Examiner* — Richard Crispino
*Assistant Examiner* — Matthew Hoover
(74) *Attorney, Agent, or Firm* — Knobbe, Martens, Olson & Bear, LLP (57) ABSTRACT

An apparatus for fabricating an organic light emitting display panel is disclosed. In one embodiment, the apparatus includes i) a first roll around which a film is wound to be continuously drawn, ii) a second roll arranged to face the first roll and around which the film is continuously wound, iii) a plurality of chambers disposed between the first and second rolls and through which the film passes, and in which laser induced thermal imaging (LITI) is performed on a substrate by forming a transfer layer on the film, and iv) a gate unit installed at least one of the chambers and disposed at at least one of a film inlet and a film output of the chambers that are installed, to maintain a substantially vacuum state in the chambers during passing of the film.

10 Claims, 6 Drawing Sheets (51) Int. Cl.

| | | |
|---|---|---|
| *B29C 45/00* | (2006.01) | |
| *B29C 47/00* | (2006.01) | |
| *B29C 43/02* | (2006.01) | |
| *B29C 49/00* | (2006.01) | |
| *B29C 51/00* | (2006.01) | |
| *B29D 24/00* | (2006.01) | |
| *B29D 29/00* | (2006.01) | |
| *B29C 43/10* | (2006.01) | |
| *B28B 21/36* | (2006.01) | |
| *A01J 21/00* | (2006.01) | |
| *A01J 25/12* | (2006.01) | |
| *A21C 3/00* | (2006.01) | |
| *A21C 11/00* | (2006.01) | |
| *A23G 1/20* | (2006.01) | |
| *A23G 3/02* | (2006.01) | |
| *A23P 1/00* | (2006.01) | |
| *B28B 11/08* | (2006.01) | |
| *B29C 55/28* | (2006.01) | |
| *G03C 8/00* | (2006.01) | |
| *G03C 1/00* | (2006.01) | |
| *G03F 7/00* | (2006.01) | |
| *B41J 2/32* | (2006.01) | |
| *B41J 2/315* | (2006.01) | |
| *G01D 15/10* | (2006.01) | |
| *H01L 51/56* | (2006.01) | |

(56) References Cited

U.S. PATENT DOCUMENTS

| | | | |
|---|---|---|---|
| 7,838,092 | B2 | 11/2010 | Iwanaga et al. |
| 2005/0196525 | A1 | 9/2005 | Phillips |
| 2006/0046197 | A1* | 3/2006 | Kim et al. .................. 430/273.1 |
| 2008/0057718 | A1 | 3/2008 | Omata et al. |
| 2009/0236977 | A1 | 9/2009 | Suh et al. |

FOREIGN PATENT DOCUMENTS

| | | |
|---|---|---|
| KR | 10-2006-0125881 A | 12/2006 |
| KR | 10-0934262 B1 | 12/2009 |
| KR | 10-0996503 B1 | 11/2010 |

* cited by examiner

APPARATUS FOR FABRICATING ORGANIC LIGHT EMITTING DISPLAY PANEL AND METHOD OF FABRICATING ORGANIC LIGHT EMITTING DISPLAY PANEL USING THE SAME

CROSS-REFERENCE TO RELATED PATENT APPLICATIONS

This application claims the benefit of Korean Patent Application No. 10-2011-0086564, filed on Aug. 29, 2011, in the Korean Intellectual Property Office, the disclosure of which is incorporated herein in its entirety by reference.

BACKGROUND

1. Field

The described technology generally relates to an apparatus for fabricating an organic light emitting display panel and a method of fabricating an organic light emitting display panel using the same.

2. Description of the Related Technology

Organic light emitting displays having merits such as a fast response speed, low power consumption, and a wide viewing angle have been extensively used as motion picture displays. Also, organic light emitting displays may be fabricated in a low temperature environment and a fabrication process thereof is simplified because it is based on existing semiconductor process technologies. Accordingly, they have drawn attention as next generation flat panel displays.

SUMMARY

One inventive aspect is an apparatus for fabricating an organic light emitting display panel, which may improve a process yield, and a method of fabricating an organic light emitting display panel using the same.

Another aspect is an apparatus for fabricating an organic light emitting display panel, which may reduce a defect due to air generated in the atmosphere, and a method of fabricating an organic light emitting display panel using the same.

Another aspect is an apparatus for fabricating an organic light emitting display panel which includes a first roll around which a film is wound to be continuously drawn, a second roll arranged to face the first roll and around which the film is continuously wound, a plurality of chambers disposed between the first roll and the second roll and through which the film passes, and in which laser induced thermal imaging (LITI) is performed on a substrate by forming a transfer layer on the film, and a gate unit installed at least one of the plurality of chambers and disposed at at least one of a film inlet and a film output of the plurality of chambers that are installed, to maintain an inner vacuum degree during passing of the film.

The plurality of chambers may include a first chamber, into which the film released from the first roll is input, having a deposition unit for forming a transfer layer on one surface of the film and outputting a film on which the transfer film is formed to the outside.

The deposition unit may include a plurality of support rolls supporting the other surface of the film, a plurality of auxiliary rolls supporting an area other than a deposition area of one surface of the film, and a deposition source ejecting a material for a transfer layer toward the one surface of the film.

The plurality of chambers may include a second chamber arranged close to the first chamber, into which the film output from the first chamber is input, having a combination unit making the film and the substrate closely contact each other such that the transfer layer of the film faces the substrate, and outputting the film and the substrate closely contacting each other, to the outside.

The combination unit may include a substrate input device making the substrate input into the second chamber contact the film and a plurality of upper and lower combination rolls, each supporting the film and the substrate contacting each other from the upper and lower sides, wherein at least one of the upper and lower combination rolls has an indented central portion.

The plurality of chambers may include a third chamber arranged close to the second chamber, into which the film and the substrate contacting each other and output from the second chamber are input, having a transfer unit transferring the transfer layer to the substrate by irradiating a laser beam onto the film or the substrate, and outputting the film and the substrate closely contacting each other, to the outside.

The transfer unit may include a beam irradiator irradiating a laser beam onto the film or the substrate, a mask interposed between the beam irradiator and the film or the substrate, and an aligner aligning the mask and the substrate.

The plurality of chambers may include a fourth chamber arranged close to the third chamber, into which the film and the substrate contacting each other and output from the third chamber are input, having a detachment unit detaching the substrate from the film, and outputting the substrate, to the outside.

The second roll may be disposed in the fourth chamber.

The detachment unit may include a detachment roll that winds the film in a direction to be separated from the substrate.

The substrate may be disposed above the film.

The gate unit may include a pair of gate blocks arranged facing each other and driven to approach and be separated from each other, a plurality of pad units disposed on surfaces of the gate blocks facing each other and supporting the film, and a plurality of vacuum suction holes installed in the gate blocks and the pads to respectively correspond to the plurality of pad units.

Each of the plurality of pad units may further include a suction unit having an edge extending close to the film, the edge being elastically deformed by pressure of the film.

Another aspect is a method of fabricating an organic light emitting display panel which includes preparing a first roll around which a film is wound, continuously drawing the firm from the first roll, forming a transfer layer on the film, and allow the film to pass through a plurality of chambers during which laser induced thermal imaging (LITI) is performed to transfer the transfer layer to a substrate, maintaining a degree of vacuum of each of the plurality of chambers when the film passes through the plurality of chambers through a gate unit installed at least one of the plurality of chambers and disposed at least one of a film inlet and a film outlet of each of the plurality of chambers that are installed, and continuously winding the film passing through the plurality of chambers around a second roll that is arranged corresponding to the first roll.

The plurality of chambers may include a first chamber into which the film released from the first roll is input, and a transfer layer is formed on one surface of the film in the first chamber.

The forming of the transfer layer may include supporting the other surface of the film using a plurality of support rolls, supporting an area other than a deposition area of one surface of the film using a plurality of auxiliary rolls, and ejecting a material for the transfer layer toward one surface of the film using a deposition source.

The plurality of chambers may include a second chamber arranged close to the first chamber, into which the film output from the first chamber is input, and the film and the substrate closely contact each other in the second chamber such that the transfer layer of the film faces the substrate.

The making of the film and the substrate closely contact each other may include the substrate input into the second chamber contacting the film using a substrate input device, and supporting the film and the substrate contacting each other respectively from upper and lower sides using a plurality of upper and lower combination rolls, wherein at least one of the upper and lower combination rolls has an indented central portion.

The plurality of chambers may include a third chamber arranged close to the second chamber, into which the film and the substrate contacting each other and output from the second chamber are input, and the transfer layer is transferred to the substrate by irradiating a laser beam onto the film or the substrate in the third chamber.

The transferring of the transfer layer to the substrate may include aligning a mask and the substrate, and irradiating a laser beam onto the film or the substrate.

The plurality of chambers may include a fourth chamber arranged close to the third chamber, into which the film and the substrate contacting each other and output from the third chamber are input, and the substrate is detached from the film in the fourth chamber.

The second roll may be disposed in the fourth chamber.

In the detaching of the substrate from the film, a detachment roll supporting the film may wind the film in a direction to be separated from the substrate.

The substrate may be disposed above the film.

The gate unit may include a pair of gate blocks arranged facing each other and driven to approach and be separated from each other, a plurality of pad units disposed on surfaces of the gate blocks facing each other and supporting the film, and a plurality of vacuum suction holes installed in the gate blocks and the pads to respectively correspond to the plurality of pad units, and in a state in which the pair of gate blocks approaching each other support the film between the plurality of pad units, an interval between the plurality of pad units becomes vacuum through the plurality of vacuum suction holes.

Each of the plurality of pad units may further include a suction unit having an edge extending close to the film, the edge being elastically deformed by pressure of the film.

DETAILED DESCRIPTION

A method of patterning an organic light emitting layer includes laser induced thermal imaging (LITI). The LITI is a method of converting laser irradiated from a light source into thermal energy and transferring a pattern forming material to a target substrate using the thermal energy, thereby forming a pattern. To use the method, a donor film on which a transfer layer is formed, a light source, and a target substrate are needed.

According to the LITI, the donor film covers the whole of the target substrate that is a receptor and the donor film and the target substrate are fixed on a stage. Laser transfer is performed on the donor film so that patterning is completed.

However, some processes of the LITI are performed in a near vacuum and some other processes are performed at atmospheric pressure. Accordingly, voids may be generated as air is trapped between the donor film and the target substrate during the combining of the donor film and the target substrate. Thus, combination defects are generated. Also, when the donor film and the target substrate are detached from each other, organic substances adhere to the donor film due to air filling the gap between the donor film and the target substrate. As a result, manufacturing yield is reduced and process time is prolonged.

Throughout the description, the terms such as "first" and "second" are used herein merely to describe a variety of constituent elements, but the constituent elements are not limited by the terms. The terms are used only for the purpose of distinguishing one constituent element from another constituent element. For example, a first constituent element may be referred to as a second constituent element, and vice versa.

The terms used in the present specification are used for explaining embodiments. Thus, the expression of singularity in the present specification includes the expression of plurality unless clearly specified otherwise in context. Also, the terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Embodiments will be described in detail with reference to the attached drawings. Like reference numerals in the drawings denote like elements.

Figure 1:
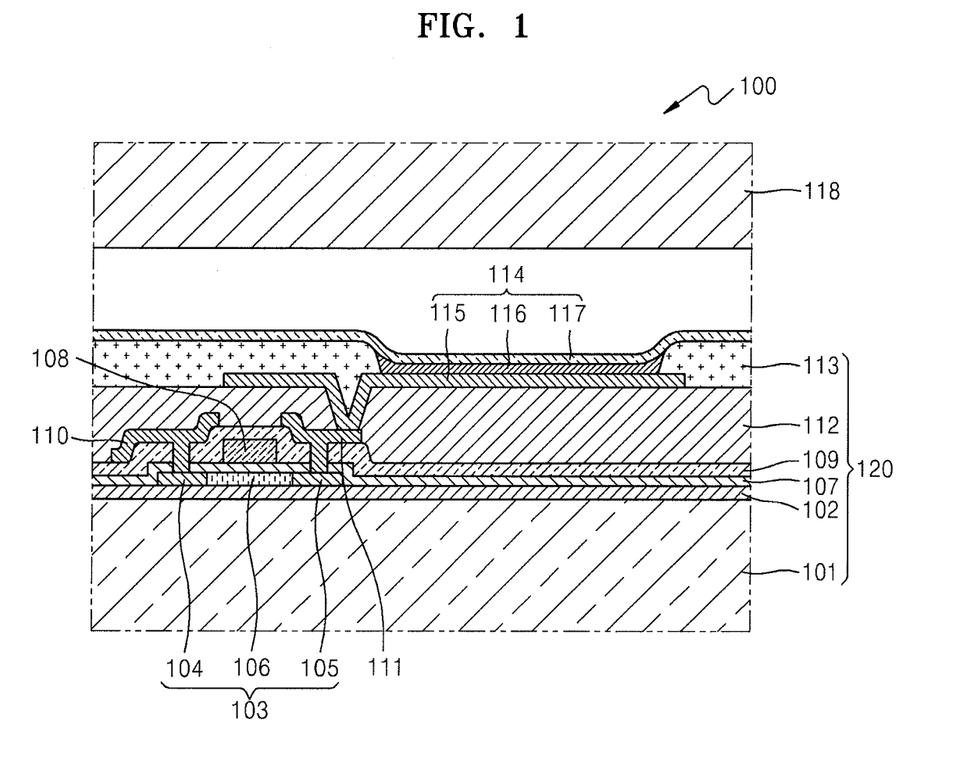
FIG. 1 is a cross sectional view schematically illustrating a structure of an organic light emitting display panel fabricated by an apparatus for fabricating an organic light emitting display panel and a method of fabricating an organic light emitting display panel using the same, according to an embodiment.

FIG. 1 is a cross sectional view schematically illustrating a structure of an organic light emitting display panel 100 fabricated by an apparatus for fabricating an organic light emitting display panel and a method of fabricating an organic light emitting display panel using the same, according to an embodiment. Referring to FIG. 1, the organic light emitting display panel 100 includes a first substrate 101. The first substrate 101 may be formed of an insulation substrate such as glass or plastic. A metal substrate having an insulation processed surface may also be used.

A buffer layer 102 is formed on a first substrate 101. The buffer layer 102 is formed of an organic substance, an inorganic substance, or has a structure in which an organic substance and an inorganic substance are alternately deposited. The buffer layer 102 performs a function of blocking oxygen and moisture and simultaneously a function of preventing dispersion of moisture or impurity generated from the first substrate 101.

A semiconductor active layer 103 having a predetermined pattern is formed on the buffer layer 102. The semiconductor active layer 103 may be formed of amorphous silicon or polycrystal silicon. The semiconductor active layer 103 may also be formed of an oxide semiconductor. For example, the semiconductor active layer 103 may be a G-I-Z-O layer [(In2O3)a(Ga2O3)b(ZnO)c layer] (a, b, and c are real numbers respectively satisfying conditions of a≥0, b≥0, and c>0). Also, the semiconductor active layer 103 may be formed of an organic semiconductor material.

A source region 104 and a drain region 105 are formed on the semiconductor active layer 103. A channel region 106 is an area between the source region 104 and the drain region 105. The semiconductor active layer 103 is covered by a gate insulation layer 107. The gate insulation layer 107 may be formed of a single layer of $SiO_2$ or a dual layer of $SiO_2$ and $SiN_x$.

A gate electrode 108 is formed in a predetermined region on an upper surface of the gate insulation layer 107. The gate electrode 108 is connected to a gate line (not shown) that applies a thin film transistor on/off signal. The gate electrode 108 may be formed of a single metal or multiple metals and may be formed of a monolayer film of Mo, MoW, Cr, Al, Al alloy, Mg, Al, Ni, W, Au, or the like, or a multilayer film of a combination thereof.

An interlayer insulating layer 109 is formed on an upper surface of the gate electrode 108. A source electrode 110 is electrically connected to the source region 104 via a contact hole. A drain electrode 111 is electrically connected to the drain region 105.

A protection layer, or a passivation and/or planarization layer, 112 is formed on upper surfaces of the source electrode 110 and the drain electrode 111. The protection layer 112 may be formed of an organic material such as acryl or benzocyclobutene (BCB), or an inorganic material such as $SiN_x$, and a variety of modifications, for example, a single layer, or a dual or multiple layer, may be available.

A first electrode 115 of an organic light emitting device 114 is formed on an upper surface of the protection layer 112. A pixel defining layer (PDL) 113, which may be formed of an organic and/or inorganic material, is formed to cover the edge of the first electrode 115. The first electrode 115 is electrically connected to one of the source electrode 110 and the drain electrode 111.

An organic layer 116 is formed on an upper surface of the first electrode 115. A second electrode 117 of the organic light emitting device 114 is formed on an upper surface of the organic layer 116.

Of the electrodes of the organic light emitting device 114, the first electrode 115 functions as an anode electrode and may be formed of various conductive materials. In the present embodiment, the first electrode 115 may be formed in a transparent electrode or a reflection electrode.

For example, the first electrode 115, when used as a transparent electrode, may be formed of ITO, IZO, ZnO, or $In_2O_3$. When the first electrode 115 is used as a reflection electrode, a reflection layer is formed of Ag, Mg, Al, Pt, Pd, Au, Ni, Nd, Ir, Cr, or a compound thereof, and then a layer formed of ITO, IZO, ZnO, or $In_2O_3$ is formed on the reflection layer.

Of the electrodes of the organic light emitting device 114, the second electrode 117 functions as a cathode electrode and may be formed as a transparent electrode or a reflection electrode. When the second electrode 117 is used as a transparent electrode, metal having a low work function, that is, Li, Ca, LiF/Ca, LiF/Al, Al, Ag, Mg, or a compound thereof is deposited on the organic layer 116 to have a thin thickness and then an auxiliary electrode layer or a bus electrode line may be formed using a material for forming a transparent electrode.

When used as a reflection electrode, the second electrode 117 is formed by depositing Li, Ca, LiF/Ca, LiF/Al, Al, Ag, Mg, or a compound thereof on an entire surface of the display.

The first electrode 115, when formed in a transparent electrode or a reflection electrode, may have a shape corresponding to an opening shape of each subpixel. The second electrode 117 may be formed by depositing a transparent electrode or a reflection electrode on an entire surface of a display area. The second electrode 117 may not be necessarily deposited on an entire surface and may be formed in a variety of patterns. The first electrode 115 and the second electrode 117 may be deposited at the opposite positions.

A small molecular or polymer organic layer may be used for the organic layer 116. When a small molecular organic material is in use, the organic layer 116 may include a hole injection transport layer (HITL), an emission layer (EML), and an electron injection transport layer (ETL), which are deposited in a single or complex structure. Also, various usable organic materials such as copper phthalocyanine (CuPc), N,N'-Di(naphthalene-1-yl)-N,N'-diphenyl-benzidine (NPB), tris-8-hydroxyquinoline aluminum (Alq3) may be used for the organic layer 116. These small molecular organic materials may be formed by a method such as a vacuum deposition method.

When a polymer organic material is in use, the organic layer 116 may include the HITL and the EML. PEDOT is used as the HITL and a polymer organic material such as a poly-phenylenevinylene (PPV) based material or a polyfluorene based material is used as the EML, which may be formed by screen printing or an inkjet print method.

The organic layer 116 is not limited to the above description and a variety of embodiments thereof may be available.

A second substrate 118 is provided above the organic light emitting device 114. The second substrate 118 may be a glass substrate or a plastic substrate. The organic light emitting device 114 may be sealed from the external atmosphere by using a thin film covering the organic light emitting device 114, instead of the second substrate 118.

In the present specification, a substrate 120 refers to a substrate in a state before the organic layer 116 including the EML is formed. The substrate 120 may include a state in which the HITL is formed in the organic layer 116.

Figure 2:
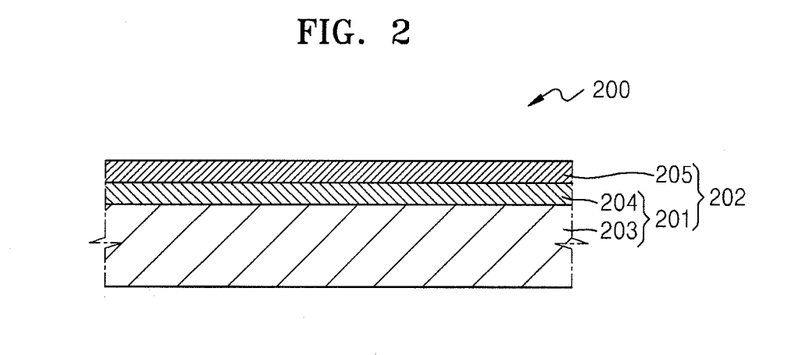
FIG. 2 is a cross sectional view of a donor film provided in a roll-to-roll type according to an embodiment.

FIG. 2 is a cross sectional view of a donor film 200 provided in a roll-to-roll type according to an embodiment. Referring to FIG. 2, the donor film 200 includes a base film 203, a transfer layer 205 disposed above the base film 203, and a photothermal conversion layer 204 arranged between the base film 203 and the transfer layer 205. As a laser beam is irradiated toward the donor film 200, the photothermal conversion layer 204 converts light energy into thermal energy and thus the transfer layer 205 is transferred to the substrate 120. A function layer for performing a particular function such as blocking moisture may be further provided at any one of an upper surface of the transfer layer 205, between the transfer layer 205 and the photothermal conversion layer 204, and the photothermal conversion layer 204 and the base film 203.

In the present specification, a state in which the transfer layer 205 is not formed is referred to as a first film 201 and a state in which the transfer layer 205 is completely formed is referred to as a second film 202.

In one embodiment, an organic light emitting display panel is fabricated in a laser induced thermal imaging (LITI) method while the donor film 200 continuously passes through a plurality of chambers.

Figure 3:
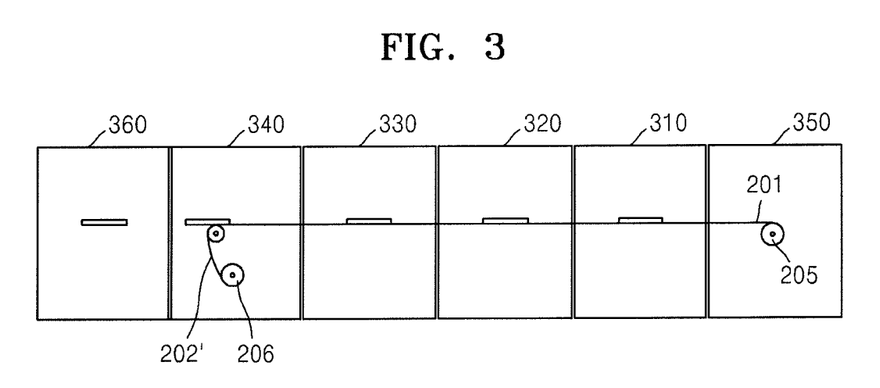
FIG. 3 is a view schematically illustrating a structure of an apparatus for fabricating an organic light emitting display panel according to an embodiment.

FIG. 3 is a view schematically illustrating a structure of an apparatus for fabricating an organic light emitting display panel according to an embodiment. Referring to FIG. 3, the apparatus for fabricating an organic light emitting display panel includes first, second, third, and fourth chambers 310, 320, 330, and 340 that are continuously arranged. A loading chamber 350 and an unloading chamber 360 are respectively communicated with the first chamber 310 and the fourth chamber 340. In one embodiment, the first to fourth chambers 310-340 are separate vacuum chambers.

Figure 4:
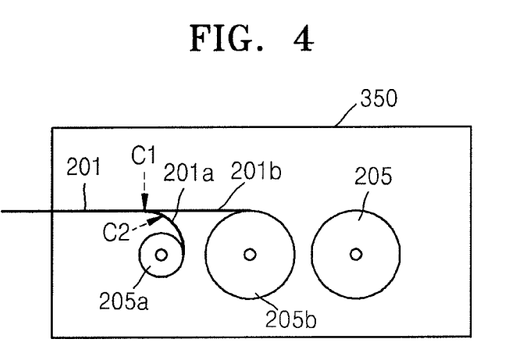
FIG. 4 is a view schematically illustrating a structure of a loading chamber of FIG. 3.

FIG. 4 is a view schematically illustrating a structure of the loading chamber 350 of FIG. 3. The loading chamber 350 is communicated with the first chamber 310 and provides the first film 201 to the first chamber 310. At least one first roll 205 is arranged in the loading chamber 350.

The loading chamber 350 may include a loadlock chamber to facilitate detachment and installation of the first roll 205. When a first roll 205a being in use is replaced with a new one, the replacement may be performed during a product maintenance (PM) operation after only the loading chamber 350 performs a vent operation. That is, a first film 201b of a first roll 205b that has been in a ready state is combined to the first film 201a of the first roll 205a that is performing a process and then the first film 201a is cut off at a cutting point C2. Thereafter, the loading chamber 350 is vacuum pumped.

Figure 5:
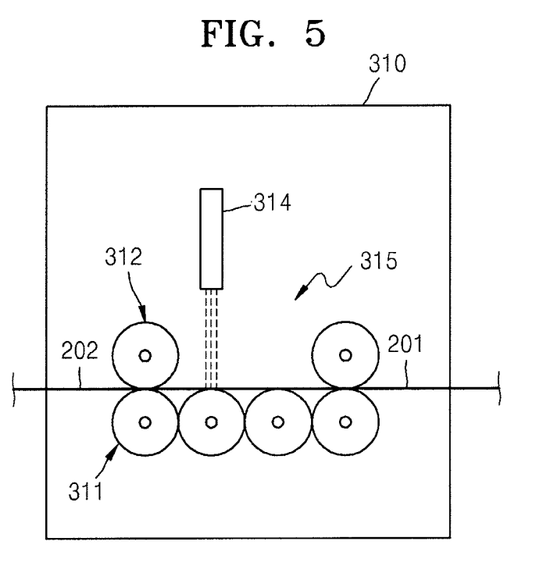
FIG. 5 is a view schematically illustrating a structure of a first chamber of FIG. 3.

FIG. 5 is a view schematically illustrating a structure of the first chamber 310 of FIG. 3. The first chamber 310 includes a deposition unit 315 that is installed inside. The first film 201 enters through one side of the first chamber 310 from the loading chamber 350.

The deposition unit 315 forms a second film 202 by forming the transfer layer 205 on one surface of the first film 201. The second film 202 is output to the outside of the first chamber 310 through the other side of the first chamber 310. The deposition unit 315 includes a plurality of support rolls 311, a plurality of auxiliary rolls 312, and a deposition source 314. The support roll 311 is connected to a separate driving source (not shown) to be rotated in one direction, and may support a lower surface of the first film 201.

Figure 6:
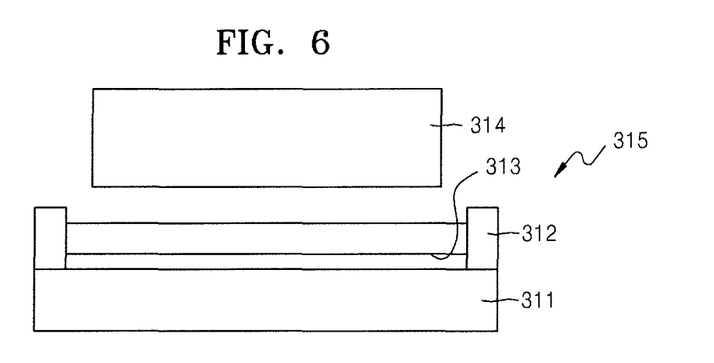
FIG. 6 is a view schematically illustrating a structure of a deposition unit of FIG. 5.

The auxiliary roll 312 may support an upper surface of the first film 201. As illustrated in FIG. 6, an indented portion 313 is formed at a central portion of the auxiliary roll 312 so as to support other areas except for a deposition area of the upper surface of the first film 201 so that the transfer layer 205 formed on the upper surface of the first film 201 may be prevented from being damaged. The auxiliary roll 312 may be disposed outside an area where a material for the transfer layer 205 is output from the deposition source 314.

The deposition source 314 disposed above the first film 201 ejects the material for the transfer layer 205 toward the upper surface of the first film 201. The first chamber 310 may be in a vacuum state.

Although in the embodiment illustrated in FIGS. 5 and 6, the deposition source 314 is disposed above the first film 201 and forms the transfer layer 205 on the upper surface of the first film 201, the deposition source 314 may be disposed under the first film 201 to form the transfer layer 205 on the lower surface of the first film 201.

Figure 7:
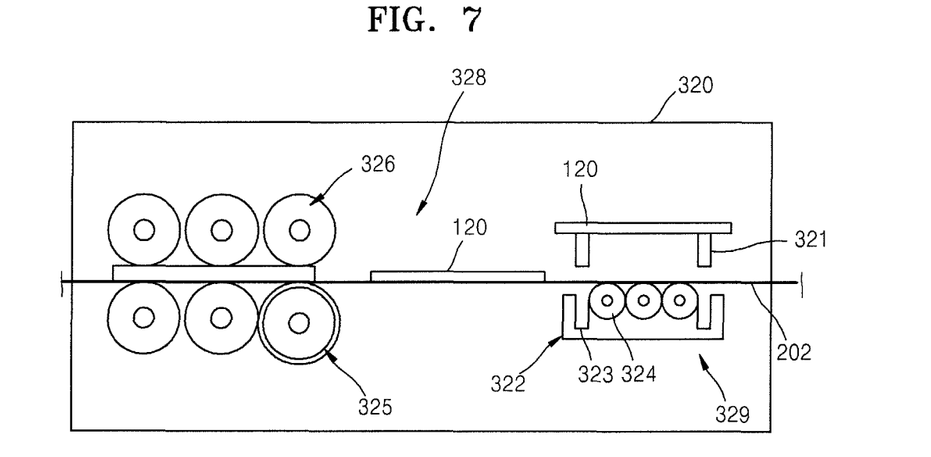
FIG. 7 is a view schematically illustrating a structure of a second chamber of FIG. 3.

FIG. 7 is a view schematically illustrating a structure of the second chamber 320 of FIG. 3. The second chamber 320 is disposed close to the first chamber 310 and the second film 202 output from the first chamber 310 is input into the second film 202 through one side thereof. A combination unit 328 is provided in the second chamber 320. The combination unit 328 closely presses the second film in the second chamber 320 against the substrate 120. The second film 202 closely contacting the substrate 120 is output to the outside through the outside of the second chamber 320.

The combination unit 328 includes a substrate input device 329, a plurality of upper combination rolls 326, and a plurality of lower combination rolls 325. The substrate input device 329 includes a support unit 321 for supporting the substrate 120 that is input into the second chamber 320 through a separate input door and a transfer unit 322 for receiving the substrate 120 from the support unit 321 and transferring the substrate 120. The transfer unit 322 includes a plurality of driving rollers 324 and a receiving unit 323 for receiving the support unit 321. The support unit 321 may be provided by a plurality of pins. As each of the pins is inserted in the receiving unit 323 so that the substrate 120 is accommodated on the second film 202 placed on the driving rollers 324.

Figure 8:
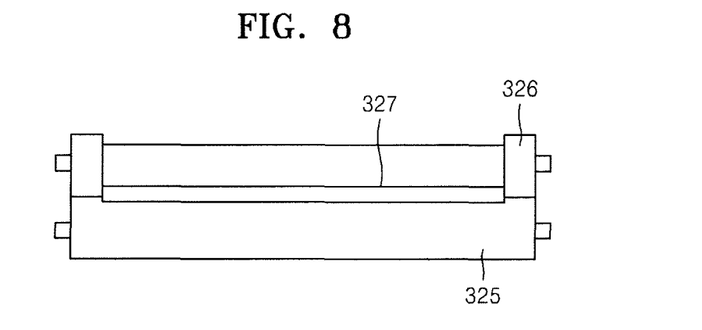
FIG. 8 is a view schematically illustrating a structure of an upper combination roll and a lower combination roll FIG. 7.

As the driving rollers 324 are rotated to transfer the second film 202 toward the upper and lower combination rolls 326 and 325, the upper combination rolls 326 support the substrate 120 and the lower combination rolls 325 support the second film 202. The combination rolls 326 and 325 press the second film 202 and the substrate 120 interposed therebetween to closely contact each other. As illustrated in FIG. 8, each of the upper combination rolls 326 has an indented portion 327 at a central portion thereof that is indented slightly less than the thickness of the substrate 120. Accordingly, the central portion of each of the upper combination rolls 326 supports the substrate 120 by pressing the upper surface of the substrate 120.

The second chamber 320 may be in a vacuum state equal to or less than a degree of a vacuum of the first chamber 310. In the embodiment of FIGS. 7 and 8, although the substrate 120 is accommodated on the upper surface of the second film 202, however, the substrate 120 may also be accommodated on the upper surface of the second film 202.

Figure 9:
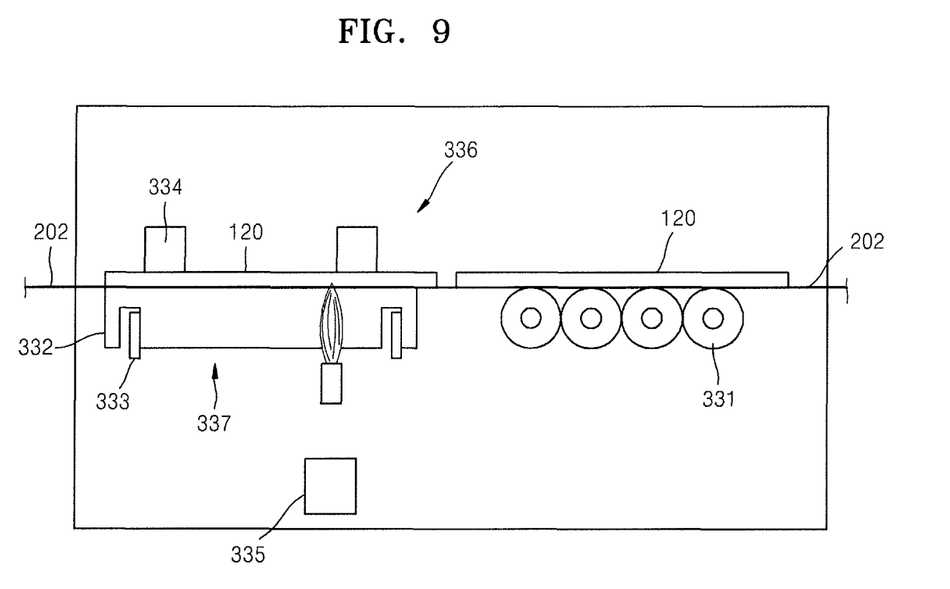
FIG. 9 is a view schematically illustrating a structure of a third chamber of FIG. 3.

FIG. 9 is a view schematically illustrating a structure of the third chamber 330 of FIG. 3. Referring to FIG. 9, the third chamber 330 is disposed close to the second chamber 320 and the second film 202 closely contacted by the substrate 120 output from the second chamber 320 is input into the third chamber 330. A transfer unit 336 for transferring the transfer layer 205 to the substrate 120 by irradiating laser onto the second film 202 or the substrate 120 is installed in the third chamber 330. The transfer unit 336 includes a beam irradiator 335 for irradiating a laser beam onto the second film 202 or the substrate 120, a mask 332 interposed between the beam irradiator 335 and the second film 202 or the substrate 120, and an aligner 337 for aligning the mask 332 and the substrate 120.

Figure 10:
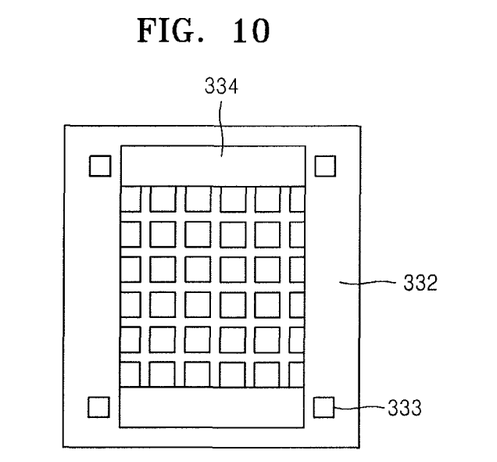
FIG. 10 is a view schematically illustrating a structure of a mask, a first camera unit, and a second camera unit of FIG. 9.

The substrate 120 and the second film 202 are transferred by a plurality of driving rollers 331 in the third chamber 330 to the left side in FIG. 9 and accommodated on the mask 332. A pattern for transmitting a laser beam is formed in the mask 332 as illustrated in FIG. 10. The pattern corresponds to a pixel pattern formed on the substrate 120.

The mask 332 and the substrate 120 are aligned by the aligner 337. First, a first camera unit 333 recognizes an align mark formed on the substrate 120 and a second camera unit 334 for recognizing a start point of a pixel aligns the mask 332 to the substrate 120. A separate driving apparatus is connected to the mask 332 so that the mask 332 may be aligned to the substrate 120 through fine adjustment of the mask 332.

After the alignment of the mask 332 and the substrate 120, a laser beam is irradiated by the beam irradiator 335 so that the transfer layer 205 formed on the second film 202 is transferred to the substrate 120. The third chamber 330 may be in a vacuum state substantially equal to or less than a degree of a vacuum of the second chamber 320.

Although FIG. 9 illustrates that the beam irradiator 335 is disposed inside the third chamber 330, the beam irradiator 335 may also be disposed outside the third chamber 330 and a laser beam may be focused at the photothermal conversion layer 204 of the second film 202 through a projection lens.

Figure 11:
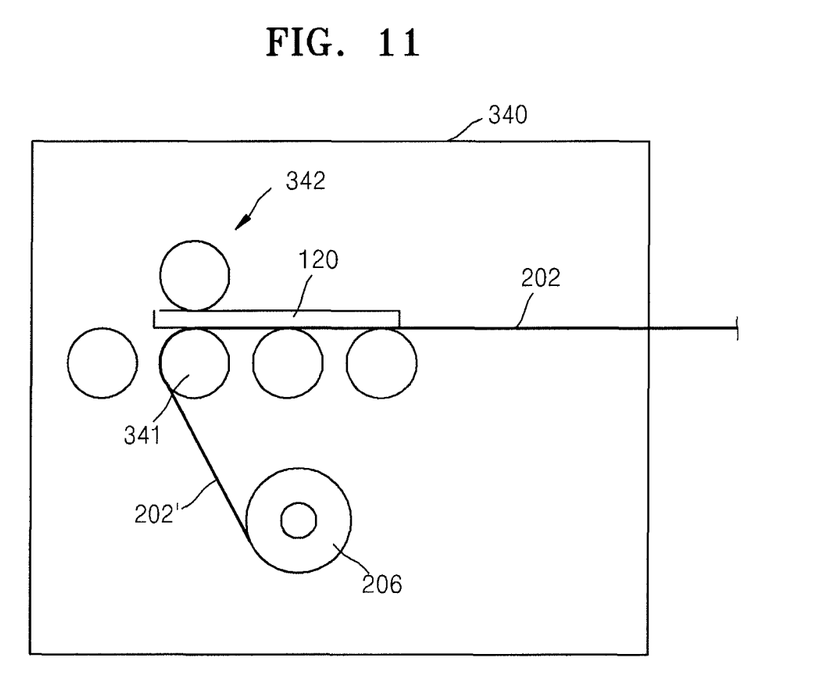
FIG. 11 is a view schematically illustrating a structure of a fourth chamber of FIG. 3.

FIG. 11 is a view schematically illustrating a structure of the fourth chamber 340 of FIG. 3. Referring to FIG. 11, the fourth chamber 340 is disposed close to the third chamber 330 and the second film 202 closely contacted by the substrate 120 output from the third chamber 330 is input into the fourth chamber 340.

A detachment unit 342 for detaching the second film 202 and the substrate 120 from each other is provided in the fourth chamber 340. The detachment unit 342 includes a detachment roll 341 that supports the second film 202 and winds the second film 202 in a direction to be separated from the substrate 120. In the embodiment of FIG. 11, the detachment roll 341 winds the second film 202 in a downward direction to connect to a second roll 206. For a rapid detachment process, the second roll 206 may be disposed in the fourth chamber 340 and the second roll 206 may be replaced during the PM operation.

When the LITI is completed in the third chamber 330 as described above, the transfer layer 205 of the second film 202 is transferred to the substrate 120 in a pattern corresponding to the pattern of the mask 332. In this state, a second film 202, from which the transfer layer 205 has been removed, corresponding to the pattern of the mask 332 passes through the detachment roll 341 to be wound around the second roll 206. To facilitate the detachment process, the substrate 120 may be disposed in an upper side whereas the second film 202 may be disposed in a lower side.

As illustrated in FIG. 2, the second film 202 includes the photothermal conversion layer 204 that converts a laser beam into thermal energy. The transfer layer 205 is transferred to the substrate 120 due to the thermal energy. The transfer layer 205 is melt and stuck to a surface of the substrate 120 due to the thermal energy. After the melting and sticking, the second film 202 tends to naturally fall down due to the gravity. In this state, when the detachment roll 341 applies a force to the second film 202' to face downwardly, the second film 202' is naturally separated from the substrate 120.

The fourth chamber 340 may be in a vacuum state substantially equal to or less than a degree of a vacuum of the third chamber 330.

The substrate 120 having passed through the process is transferred to the unloading chamber 360 as illustrated in FIG. 3 and drawn out for a subsequent process.

Figure 12:
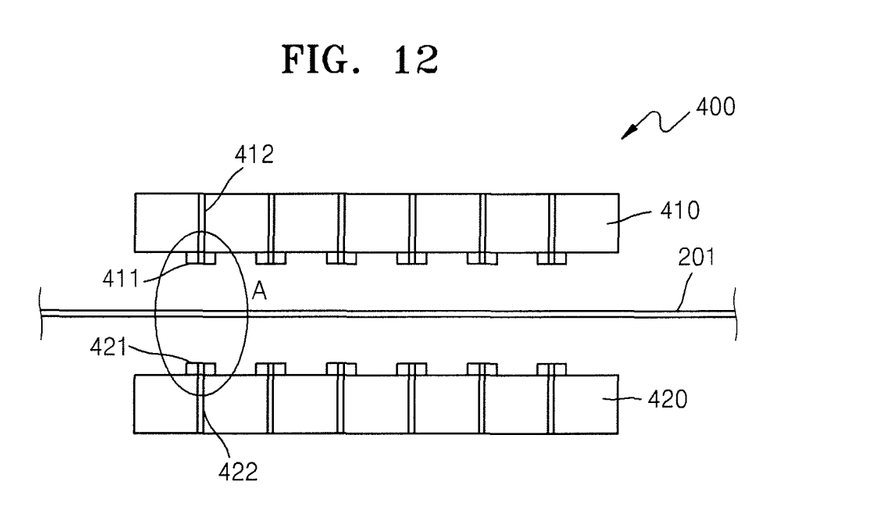
FIG. 12 is a view schematically illustrating a structure of a gate unit.
Figure 13:
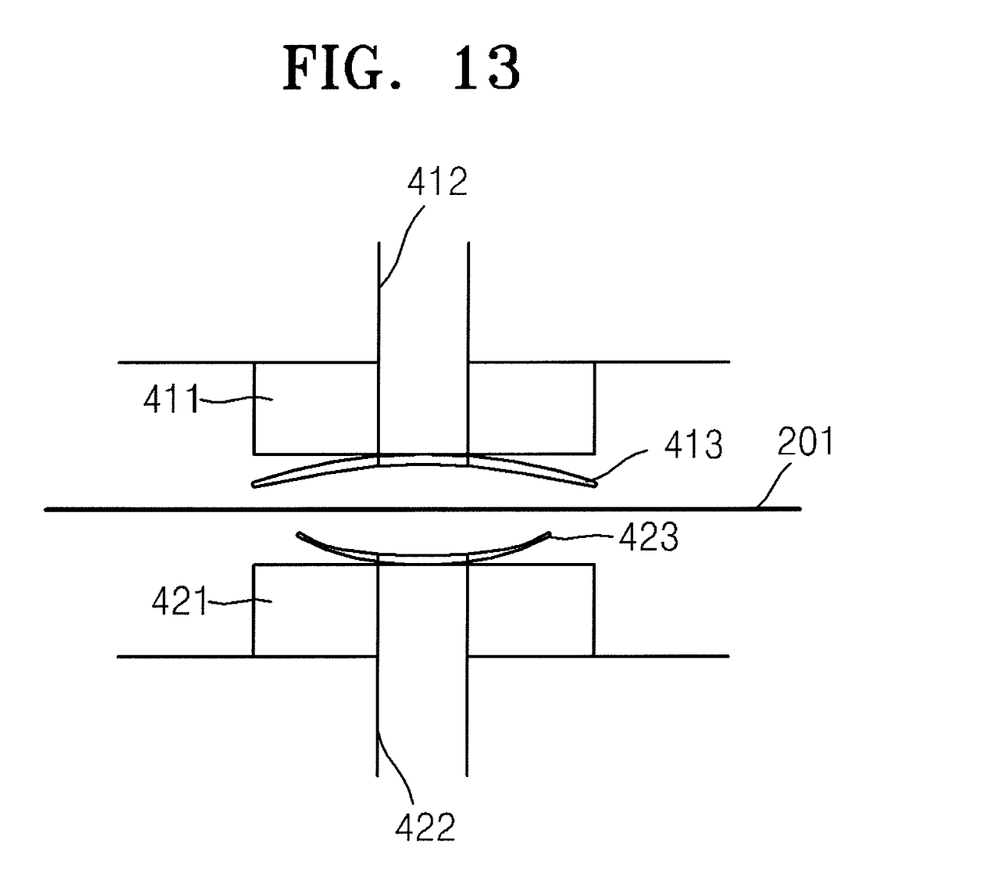
FIG. 13 is a magnified cross sectional view of a portion A of FIG. 12.

In one embodiment, as illustrated in FIGS. 12 and 13, a gate unit 400 is installed at least one of a film inlet and a film outlet of at least one of the chambers to maintain an inner vacuum degree during passing of the donor film 200.

For example, the gate unit 400 may be installed between the loading chamber 350 and the first chamber 310, between the first and second chambers 310 and 320, between the third and fourth chambers 330 and 340, and/or between the fourth chamber 230 and the unloading chamber 360.

FIG. 12 is a view schematically illustrating an example of the gate unit 400 installed between the loading chamber 350 and the first chamber 310. FIG. 13 is a magnified cross sectional view of a portion A of FIG. 12.

A first gate block 410 and a second gate block 420 are arranged to face each other and may be driven to approach and be separated from each other. Both of the first and second gate blocks 410 and 420 may be driven, or one of the gate blocks 410 and 4240 may be fixed whereas the other one is driven.

A plurality of first pad units 411 are formed on a surface of the first gate block 410 facing the second gate block 420, whereas a plurality of second pad units 421 are formed on a surface of the second gate block 420 facing the first gate block 410. The first pad units 411 and the second pad units 421 protrude from the surfaces of the first and second gate blocks 410 and 420 facing each other. When the first and second gate blocks 410 and 420 are driven to approach each other, that is, perform a closing operation, the first pad units 411 and the second pad units 421 contact each other.

A first vacuum suction hole 412 is formed in the first gate block 410 and extends to each of the first pad units 411. A second vacuum suction hole 422 is formed in the second gate block 420 and extends to each of the second pad units 421.

Each of the first pad units 411 further includes a first suction unit 413 on a surface of each of the first pad units 411 facing each of the second pad units 421. The first suction unit 413 extends such that an edge thereof is curved downwardly. The edge is elastically deformed upwardly as the first suction unit 413 is pressed downwardly.

Each of the second pad units 421 further includes a second suction unit 423 on a surface of each of the second pad units 421 facing each of the first pad units 411. The second suction unit 423 extends such that an edge thereof is curved upwardly. The edge is elastically deformed downwardly as the second suction unit 423 is pressed upwardly.

The first suction unit 413 and the second suction unit 423 may be formed of an elastic material such as rubber, urethane, or silicon.

In FIG. 13, the first suction unit 413 is illustrated to be larger than the second suction unit 423. However, the second suction unit 423 may also be formed to be larger than the first suction unit 413. Alternatively, the first suction unit 413 and the second suction unit 423 may have the same size.

The first vacuum suction hole 412 and the second vacuum hole 422 may extend to the first suction unit 413 and the second suction unit 423, respectively.

According to the above structure, when the gate unit 400 is closed, an interval between the first and second blocks 410 and 420 has a degree of vacuum higher than a connected chamber, that is, the first chamber 310, via the first and second vacuum suction holes 412 and 422, the first and second pad units 411 and 421, in particular, the first and second suction units 413 and 423, may suck the first film 201 using a difference in vacuum pressure. As described above, since the first and second suction units 413 and 423 are formed of an elastic material so as to be elastically deformed and to closely contact the first film 201. Accordingly, the sealing of the first chamber 310 may be maintained using the gate unit 400.

When the gate unit 400 is open, the interval between the first and second gate blocks 410 and 420 may be decreased. In one embodiment, the first film 201 has a thickness of about 0.01 mm to about 1 mm and thus the interval between the first and second gate blocks 410 and 420 may be maintained as narrow as possible, except for a case of being moved together with the substrate 120. Accordingly, a degree of vacuum of the chamber where the gate unit 400 is installed may be maintained.

Accordingly, whenever a process is performed in each chamber, the gate unit 400 is closed to maintain the sealing. When the film 201 is transferred, the gate unit 400 is open to make loss of vacuum as low as possible.

Next, a method of fabricating an organic light emitting display panel using the organic light emitting display panel according to an embodiment will be described below.

First, as illustrated in FIG. 1, the substrate 120 in which the first electrode 115 and the pixel define layer 113 are formed on the protection layer 112 is prepared. In the substrate 120, the HITL of the organic layer 116 may be formed on the first electrode 115 and the pixel define layer 113.

The first film 201 as illustrated in FIG. 2 is prepared. The first film 201 is wound around the first roll 205 as illustrated in FIG. 3.

At the initial stage of the process, the first film 201 wound around the first roll 205 may be wound around the second roll 206 located in the fourth chamber 340. This is to perform the overall process in a roll-to-roll process method.

A degree of vacuum of each chamber is independently maintained.

When the process is performed, the gate unit 400 installed between the neighboring chambers is open and the first film 201 is moved from the loading chamber 350 to the first chamber 310.

In the first chamber 310, the lower surface of the first film 201 is supported by the support rolls 311 and the upper surface of the first film 201 is supported by the auxiliary rolls 312. The auxiliary rolls 312 support an area other than the deposition area of the supper surface of the first film 201. The deposition source 315 ejects a material for the transfer layer 205 toward the upper surface of the first film 201. Thus, the transfer layer 205 is formed on the upper surface of the first film 201 and the first film 201 becomes the second film 202 when the first film 201 leaves the first chamber 310.

During the deposition, the gate unit 400 is closed so that a degree of vacuum of the first chamber 310 may be maintained. When the degrees of vacuum of the loading chamber 350 and the first chamber 310 are substantially the same, the gate unit 400 between the loading chamber 350 and the first chamber 310 may be open. When the degrees of vacuum of the first chamber 310 and the second chamber 320 are the same, the gate unit 400 between the first chamber 310 and the second chamber 320 may be open.

Next, the gate unit 400 between the first and second chambers 310 and 320 is open, and the second film 202 output from the first chamber 310 is transferred to the second chamber 320. After the transfer, the gate unit 400 between the first and second chamber 310 and 320 is closed and the process may be performed in the second chamber 320. However, when the degrees of vacuum of the first and second chambers 310 and 320 are the same, the gate unit 400 between the two chambers 310 and 320 may be open.

The substrate 120 is input into the second chamber 320 through a separate inlet. The substrate 120 input into the second chamber 320 is supported by the support unit 321. As the support portion 321 descends and inserted into the receiving unit 323, the substrate 120 is accommodated on the second film 202 placed on the driving rollers 324.

In this state, when the driving rollers 324 rotate to transfer the second film 202 toward the upper and lower combination rolls 326 and 325, the upper combination rolls 326 support the substrate 120 and the lower combination rolls 325 support the second film 202. The upper and lower combination rolls 326 and 325 press the second film 202 and the substrate 120 interposed therebetween to closely contact each other. Since the central portion of the upper combination roll 326 has the indented portion 327 that is indented slightly less than the thickness of the substrate 120 as illustrated in FIG. 8, the central portion of the upper combination roll 326 accordingly presses and supports the upper surface of the substrate 120.

Next, the gate unit 400 between the second chamber 320 and the third chamber 330 is open, and the second film 202 and the substrate 120 output from the second chamber 320 are transferred to the third chamber 330. After the transfer, the gate unit 400 between the second and third chambers 320 and 330 is closed and the process may be performed in the third chamber 330. However, when the degrees of vacuum of the second and third chamber 320 and 330 are substantially the same, the gate unit 400 between the chambers 320 and 330 may be open during the process.

The substrate 120 and the second film 202 are transferred together by the driving rollers 331 in the third chamber 330 and accommodated on the mask 332.

The first camera unit 333 recognizes an align mark formed on the substrate 120. The mask 332 and the substrate 120 are aligned by the second camera unit 334 for recognizing a start portion of a pixel. The mask 332 is connected to a separate driving apparatus and thus the mask 332 may be aligned to the substrate 120 through a fine adjustment of the mask 332.

After the alignment of the mask 332 and the substrate 120, the beam irradiator 335 irradiates a laser beam to transfer the transfer layer formed on the second film 220 to the substrate 120.

Next, the gate unit 400 between the third chamber 330 and the fourth chamber 340 is open, the second film 202 and the substrate 120 output from the third chamber 330 are transferred to the fourth chamber 340. By making the degrees of vacuum of the third and fourth chambers 330 and 340 to be the same, the gate unit 400 between the third chamber 330 and the fourth chamber 340 may be open.

In the fourth chamber 340, since the detachment roll 341 winds the second film 202 to be connected to the second roll 206 from under the second film 202, the second film 202 is detached from the substrate 120. In doing so, to facilitate the detachment process, the second roll 206 may be disposed in the fourth chamber 340. As described above, the second film 202 is disposed under the substrate 120.

The above-described roll-to-roll process may be variously changed by changing the position of each chamber. For example, as illustrated in FIG. 5, the input direction of the first film may be reversed to have the deposition source 314 disposed under the first film 201 in the deposition process of FIG. 5. In this case, the second to fourth chambers 320-340 and the unloading chamber 360 are disposed under or above the first chamber 310 so that the up/down sides and the proceeding direction of the second film 202 output from the first chamber 310 may be reversed.

The reversion of a flow direction may occur between the first and second chambers 310 and 320, between the second and third chambers 320 and 330, and/or between the third and fourth chambers 330 and 340.

A test zone may be further provided at a leading end of the first chamber 301, that is, in the loading chamber 350 or between the loading chamber 350 and the first chamber 310, so that a defect of the first film 201 may be detected.

Also, a test zone may be further provided in the fourth chamber 340. Accordingly, a defect of the second film 202' having completed the LITI process may be detected through a review test so that each process in the first to fourth chambers 310-340 may be improved.

According to at least one of the disclosed embodiments, the roll-to-roll type LITI method may be embodied continuously or non-continuously in some sections. Accordingly, an organic light emitting display panel may be more efficiently fabricated.

Also, since the degree of vacuum of each chamber may independently maintained and the substrate and/or film is prevented from being exposed to the air during a process, a defect due to air, that is, a void is formed as air is trapped between the donor film and the substrate during the combination of the donor film and the substrate, may be prevented. Furthermore, a combination detect generated according to the above problem, which deteriorates productivity, may be prevented. In addition, when the donor film and the substrate are detached from each other, a back transfer phenomenon that organic substances adhere to the donor film due to the air intruding between the donor film and the substrate when the donor film and the substrate are detached from each other may be prevented. Therefore, yield may be improved and a process time may be reduced.

While the above embodiments have been described with reference to the accompanying drawings, it will be understood by those skilled in the art that various changes in form and details may be made therein without departing from the spirit and scope of the appended claims.

What is claimed is:

1. A method of fabricating an organic light emitting display panel, the method comprising:
preparing a first roll around which a film is wound;
substantially continuously drawing the film from the first roll so as to allow the film to pass through a plurality of chambers during which laser induced thermal imaging (LITI) is performed to transfer a transfer layer formed on the film to a substrate;
maintaining a substantially vacuum state in each of the chambers while the film passes through the chambers through a gate unit installed at at least one of the chambers and disposed at at least one of a film inlet and a film outlet of each of the chambers that are installed; and
substantially continuously winding the film which passes through the chambers around a second roll that is arranged corresponding to the first roll,
wherein the chambers comprises a first chamber configured to receive the film released from the first roll, wherein the transfer layer is formed on a first surface of the film in the first chamber,
wherein the chambers comprise a second chamber arranged close to the first chamber and configured to perform i) receiving the film output from the first chamber and ii) making the film and the substrate closely contact each other in the second chamber such that the transfer layer of the film faces the substrate,
wherein the making of the film and the substrate closely contact each other comprises:
contacting the substrate input into the second chamber and the film via a substrate input device; and
supporting the film and substrate from upper and lower sides via a plurality of upper and lower combination rolls, respectively,
and wherein at least one of the upper and lower combination rolls has an indented central portion.

2. The method of claim 1, wherein the forming of the transfer layer comprises:
supporting a second surface of the film via a plurality of support rolls, wherein the second surface is opposing the first surface;
supporting an area other than a deposition area of the first surface of the film via a plurality of auxiliary rolls; and
depositing a material for the transfer layer toward the first surface of the film.

3. The method of claim 1, wherein the chambers comprise a third chamber arranged close to the second chamber and configured to receive the film and substrate output from the second chamber, and wherein the transfer layer is transferred to the substrate based on a laser beam irradiated onto the film or the substrate in the third chamber.

4. The method of claim 3, wherein the transferring of the transfer layer to the substrate comprises:
aligning a mask and the substrate; and
irradiating a laser beam onto the film or the substrate.

5. A method of fabricating an organic light emitting display panel, the method comprising:
preparing a first roll around which a film is wound;
substantially continuously drawing the film from the first roll so as to allow the film to pass through a plurality of chambers during which laser induced thermal imaging (LITI) is performed to transfer a transfer layer formed on the film to a substrate;
maintaining a substantially vacuum state in each of the chambers while the film passes through the chambers through a gate unit installed at at least one of the chambers and disposed at at least one of a film inlet and a film outlet of each of the chambers that are installed; and
substantially continuously winding the film which passes through the chambers around a second roll that is arranged corresponding to the first roll,
wherein the chambers comprises a first chamber configured to receive the film released from the first roll, and wherein the transfer layer is formed on a first surface of the film in the first chamber,
wherein the chambers comprise a second chamber arranged close to the first chamber and configured to perform i) receiving the film output from the first chamber and ii) making the film and the substrate closely contact each other in the second chamber such that the transfer layer of the film faces the substrate,
wherein the chambers comprise a third chamber arranged close to the second chamber and configured to receive the film and substrate output from the second chamber, wherein the transfer layer is transferred to the substrate based on a laser beam irradiated onto the film or the substrate in the third chamber, and
wherein the chambers comprise a fourth chamber arranged close to the third chamber and configured to receive the film and substrate output from the third chamber, the substrate being detached from the film in the fourth chamber.

6. The method of claim 5, wherein the second roll is disposed in the fourth chamber.

7. The method of claim 5, wherein the detaching of the film comprises winding the film via a detachment roll which supports the film in a direction to be separated from the substrate.

8. The method of claim 1, wherein the substrate is disposed above the film.

9. A method of fabricating an organic light emitting display panel, the method comprising:
preparing a first roll around which a film is wound;
substantially continuously drawing the film from the first roll so as to allow the film to pass through a plurality of chambers during which laser induced thermal imaging (LITI) is performed to transfer a transfer layer formed on the film to a substrate;
maintaining a substantially vacuum state in each of the chambers while the film passes through the chambers through a gate unit installed at at least one of the chambers and disposed at at least one of a film inlet and a film outlet of each of the chambers that are installed; and substantially continuously winding the film which passes through the chambers around a second roll that is arranged corresponding to the first roll, wherein the gate unit comprises i) a pair of gate blocks arranged facing each other and driven to approach and be separated from each other, ii) a plurality of pad units disposed on surfaces of the gate blocks facing each other and supporting the film, and iii) a plurality of vacuum suction holes installed in the gate blocks and the pads to respectively correspond to the pad units, and in a state in which the pair of gate blocks approaching each other support the film between the pad units, and wherein the interval between the pad units becomes substantially vacuum through the vacuum suction holes.

10. The method of claim 9, wherein each of the pad units further comprises a suction unit having an edge extending close to the film, the edge being elastically deformed by a pressure applied from the film.

* * * * *